US012114446B2

(12) United States Patent
Feng (10) Patent No.: US 12,114,446 B2
(45) Date of Patent: Oct. 8, 2024

(54) FOLDING DISPLAY DEVICE

(71) Applicant: Wuhan China Star Optoelectronics Semiconductor Display Technology Co., Ltd., Wuhan (CN)

(72) Inventor: Zikang Feng, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/602,785

(22) PCT Filed: Sep. 2, 2021

(86) PCT No.: PCT/CN2021/116272
§ 371 (c)(1),
(2) Date: Oct. 11, 2021

(87) PCT Pub. No.: WO2023/010638
PCT Pub. Date: Feb. 9, 2023

(65) Prior Publication Data
US 2024/0164033 A1 May 16, 2024

(30) Foreign Application Priority Data
Aug. 4, 2021 (CN) .......................... 202110891184.5

(51) Int. Cl.
*H05K 5/02* (2006.01)
(52) U.S. Cl.
CPC ................................. *H05K 5/0226* (2013.01)

(58) Field of Classification Search
None
See application file for complete search history.

(56) References Cited

U.S. PATENT DOCUMENTS

| | | | |
|---|---|---|---|
| 10,564,682 B1* | 2/2020 | Wu | H05K 5/0226 |
| 10,761,574 B1* | 9/2020 | Hsu | G06F 1/1626 |
| 2017/0142847 A1* | 5/2017 | Park | H05K 5/0226 |
| 2018/0146560 A1* | 5/2018 | Chen | G06F 1/1626 |
| 2019/0391618 A1* | 12/2019 | Hsu | G06F 1/1616 |

(Continued)

FOREIGN PATENT DOCUMENTS

| | | |
|---|---|---|
| CN | 105818962 A | 8/2016 |
| CN | 107092303 A | 8/2017 |
| CN | 108862046 A | 11/2018 |

(Continued)

*Primary Examiner* — James Wu
*Assistant Examiner* — Christopher L Augustin
(74) *Attorney, Agent, or Firm* — Nathan & Associates; Menachem Nathan (57) ABSTRACT

A folding display device is provided in an embodiment of the present application. The folding display device includes a housing, a folding mechanism, a flexible display panel, and a linkage slider. The housing includes a first housing and a second housing. The folding mechanism is accommodated in the housing and rotatably connected to the first housing and the second housing. The flexible display panel is provided on one side of the first housing, the second housing, and the folding mechanism. The linkage slider is provided between the first housing or the second housing and the folding portion, and is slidably connected along a longitudinal symmetry axis of a folding portion.

20 Claims, 5 Drawing Sheets

(56) References Cited

U.S. PATENT DOCUMENTS

2020/0293094 A1* 9/2020 Liu ...................... G06F 1/1652

FOREIGN PATENT DOCUMENTS

| | | |
|---|---|---|
| CN | 109712537 A | 5/2019 |
| CN | 111887944 A | 11/2020 |
| CN | 112150921 A | 12/2020 |
| CN | 112153188 A | 12/2020 |
| CN | 212298351 U | 1/2021 |
| CN | 212853988 U | 4/2021 |
| CN | 112901743 A | 6/2021 |
| EP | 3627805 A1 | 3/2020 |
| KR | 20210009574 A | 1/2021 |

* cited by examiner

FIG. 6B

FOLDING DISPLAY DEVICE

TECHNICAL FIELD

The application relates to the field of display technology, in particular to a folding display device.

BACKGROUND

Folding display devices are one of the hot spots of future electronic products. At present, the folding display devices have become a major developing direction of display industry. An urgent problem to be solved by the folding display devices is that a surface of a mechanism before and after folding the display devices does not match a size of a flexible display screen.

However, a plurality of rail mechanisms is required to realize a folding of current folding display devices, thereby occupying excessive space. There are protrusions when a display screen is unfolded to a planar structure, resulting in unevenness of the display surface and damage to the display screen.

Therefore, a folding display device is urgently needed to solve above technical problems.

Technical Problems

With folding display device in prior art to be folded, there is a technical problem that a surface between a rail inner folding mechanism and a display screen is uneven due to excessive occupied space of the rail inner folding mechanism.

SUMMARY

An embodiment of the present application provides a folding display device including a housing, a folding mechanism, a flexible display panel and a linkage slider.

The housing includes a first housing and a second housing. The folding mechanism is accommodated in the housing and connected to the first housing and the second housing, and the folding mechanism is rotatably connected to the first housing and the second housing. The flexible display panel is disposed in the housing and on a side of the first housing, the second housing, and the folding mechanism. The linkage slider is disposed between the first housing or the second housing and a folding portion, and slidably connected along a longitudinal symmetry axis of the folding portion, wherein a first end of the linkage slider is slidably connected to a side of the first housing close to the folding portion, and a second end of the linkage slider is slidably connected to a side of the second housing close to the folding portion.

The first housing, the second housing, and the folding mechanism are in a same plane when the folding display device is in an unfolded state; the first housing and the second housing are disposed symmetrically relative to a longitudinal symmetry axis of the folding mechanism when the folding display device is in an inwardly folded state; and an orthographic projection of the first housing on the flexible display panel overlaps with an orthographic projection of the second housing on the flexible display panel when the folded display device is in a fully folded state.

In the folding display device provided in an embodiment of the present embodiment, the folding mechanism includes a folding portion, a first support plate, a first rotating plate, a second support plate, and a second rotating plate.

The first support plate and the first rotating plate are disposed on a first side of the folding portion and corresponding to the first housing. The second support plate and the second rotating plate are disposed on a second side of the folding portion and corresponding to the second housing. The first support plate is connected to the first housing, a first end of the first rotating plate is slidably connected to the first support plate, a second end of the first rotating plate is rotatably connected to the first side of the folding portion, a first end of the second rotating plate is slidably connected to the second support plate, and a second end of the second rotating plate is slidably connected to the second side of the folding portion.

In the folding display device provided in an embodiment of the present application, a first arc-shaped chute is provided within the first housing, a first arc-shaped protrusion corresponding to the first arc-shaped chute is provided on the first support plate, a second arc-shaped chute is provided within the second housing, and a second arc-shaped protrusion corresponding to the second arc-shaped chute is provided on the second support plate.

The first arc-shaped protrusion and the second arc-shaped protrusion are disposed symmetrically relative to the longitudinal symmetry axis of the folding portion.

In the folding display device provided in an embodiment of the present application, a protrusion direction of the first arc-shaped protrusion or the second arc-shaped protrusion is same as a protrusion direction of a bottom edge of a cross section of the folding portion.

In the folding display device provided in an embodiment of the present application, a first linear chute is provided on a surface of the first rotating plate away from the flexible display panel, and the first rotating plate is slidably connected to the first support plate via the first linear chute.

A second linear chute is provided on a surface of the second rotating plate away from the flexible display panel, and the second rotating plate is slidably connected to the second support plate via the second linear chute.

With the folding display device from the unfold state being folded to the folded state, a spacing of the first end of the first rotating plate to the first arc-shaped protrusion is gradually increased and a spacing of the first end of the second rotating plate to the second arc-shaped protrusion is gradually increased.

In the folding display device provided in an embodiment of the present application, the linkage slider includes a slider body, a cylindrical slider, and a rectangular slider.

The slider body is disposed parallel to a direction of a bottom of the housing and slidably connected to the folding portion at a longitudinal symmetry axis of the folding portion. The cylindrical slider is disposed at either end of the slider body and slidably connected to a first chute on an inner side of the first housing or the second housing. The rectangular slider is located on the slider body, wherein a longitudinal symmetry axis of the rectangular slider overlaps with the longitudinal symmetry axis of the folding portion, and the rectangular slider is slidably connected to a second chute on an inner side of the folding portion.

When the folding display device is in the unfolded state, the cylindrical slider is located on a same horizontal plane with a bottom of the folding portion; and when the folding display device is in the folded state, a top of the rectangular slider is located on a same horizontal plane with a top of the folding portion.

In the folding display device provided in an embodiment of the present application, the first chute includes a first sub-chute disposed on the first housing and a second sub-chute disposed on the second housing, and the first sub-chute and the second sub-chute are disposed symmetrically relative to a center line of the second chute.

In the folding display device provided in an embodiment of the present application, at any time, in a direction perpendicular to a cross section of the folding portion, an angle between the first support plate and the first housing, an angle between the second support plate and the second housing, an angle between the first rotating plate and the first housing, and an angle between the second rotating plate and the second housing are equal; an angle between the first rotating plate and the folding portion is different from an angle between the first housing and the folding portion; and an angle between the second rotating plate and the folding portion is different from an angle between the second housing and the folding portion.

In the folding display device provided in an embodiment of the present application, when the folding display device is in the unfolded state, the first housing rotates around the folding portion by a first rotation center, the second housing rotates around the folding portion by a second rotation center, the first rotating plate rotates around the folding portion by a third rotation center, the second rotating plate rotates around the folding portion by a fourth rotation center, the first support plate rotates around the first housing by a fifth rotation center, and the second support plate rotates around the second housing by a sixth rotation center.

The first rotation center and the second rotation center are respectively located on a cross section of the folding portion, the first rotation center and the second rotation center are disposed symmetrically relative to the longitudinal symmetry axis of the folding portion; the third rotation center is located at a position connected the first rotating plate and the folding portion, the fourth rotation center is located at a position connected the first rotating plate and the folding portion, the third rotation center and the fourth rotation center are disposed symmetrically relative to the longitudinal axis of the folding portion, the fifth rotation center is located at a center of the first arc-shaped protrusion, the sixth rotation center is located at a center of the second arc-shaped protrusion, and the fifth rotation center and the sixth rotation center are disposed symmetrically relative to the longitudinal symmetry axis of the folding portion.

In the folding display device provided in an embodiment of the present application, a spacing between the second rotation center and the longitudinal symmetry axis of the folding portion ranges from 0 mm to 3 mm, a spacing between the second rotation center and a surface of the second support plate away from the folding portion ranges from 0 mm to 1 mm, a spacing between the fourth rotation center and the longitudinal symmetry axis of the folding portion ranges from 2 mm to 8 mm, a spacing between the fourth rotation center and a surface of the second support plate away from the folding portion ranges from 0 mm to 2 mm, a spacing between the sixth rotation center and the longitudinal symmetry axis of the folding portion ranges from 5 mm to 25 mm, and a spacing between the sixth rotation center and a surface of the second support plate away from the folding portion ranges from 0 mm to 1.5 mm.

Accordingly, an embodiment of the present application further provides a folding display device including a housing, a folding mechanism, a flexible display panel and a linkage slider.

The housing includes a first housing and a second housing. The folding mechanism is accommodated in the housing and connected to the first housing and the second housing, and the folding mechanism being rotatably connected to the first housing and the second housing. The flexible display panel is disposed in the housing and on a side of the first housing, the second housing, and the folding mechanism. The linkage slider is disposed between the first housing or the second housing and a folding portion, and slidably connected along a longitudinal symmetry axis of the folding portion, wherein a first end of the linkage slider is slidably connected to a side of the first housing close to the folding portion, and a second end of the linkage slider is slidably connected to a side of the second housing close to the folding portion.

In the folding display device provided in an embodiment of the present application, the folding mechanism includes a folding portion, a first support plate, a first rotating plate, a second support plate and a second rotating plate.

The first support plate and the first rotating plate are on a first side of the folding portion and corresponding to the first housing. The second support plate and the second rotating plate are disposed on a second side of the folding portion and provided corresponding to the second housing. The first support plate is connected to the first housing, a first end of the first rotating plate is slidably connected to the first support plate, a second end of the first rotating plate is rotatably connected to the first side of the folding portion, a first end of the second rotating plate is slidably connected to the second support plate, and a second end of the second rotating plate is slidably connected to the second side of the folding portion.

In the folding display device provided in an embodiment of the present application, a first arc-shaped chute is provided within the first housing, a first arc-shaped protrusion corresponding to the first arc-shaped chute is provided on the first support plate, a second arc-shaped chute is provided within the second housing, and a second arc-shaped protrusion corresponding to the second arc-shaped chute is provided on the second support plate.

The first arc-shaped protrusion and the second arc-shaped protrusion are disposed symmetrically relative to the longitudinal symmetry axis of the folding portion.

In the folding display device provided in an embodiment of the present application, a protrusion direction of the first arc-shaped protrusion or the second arc-shaped protrusion is same as a protrusion direction of a bottom edge of a cross section of the folding portion.

In the folding display device provided in an embodiment of the present application, a first linear chute is provided on a surface of the first rotating plate away from the flexible display panel, and the first rotating plate is slidably connected to the first support plate via the first linear chute.

A second linear chute is provided on a surface of the second rotating plate away from the flexible display panel, and the second rotating plate is slidably connected to the second support plate via the second linear chute.

With the folding display device from the unfold state being folded to the folded state, a spacing of the first end of the first rotating plate to the first arc-shaped protrusion is gradually increased, and a spacing of the first end of the second rotating plate to the second arc-shaped protrusion is gradually increased.

In the folding display apparatus provided in an embodiment of the present embodiment, the linkage slider includes a slider body, a cylindrical slider, and a rectangular slider.

The slider body is disposed parallel to a direction of a bottom of the housing and slidably connected to the folding portion at a longitudinal symmetry axis of the folding portion. The cylindrical slider is disposed at either end of the slider body and slidably connected to a first chute on an inner side of the first housing or the second housing. The rectangular slider is located on the slider body, wherein a longitudinal symmetry axis of the rectangular slider overlaps with the longitudinal symmetry axis of the folding portion, and the rectangular slider is slidably connected to a second chute on an inner side of the folding portion.

When the folding display device is in an unfolded state, the cylindrical slider is located on a same horizontal plane with a bottom of the folding portion; and when the folding display device is in the folded state, a top of the rectangular slider is located on a same horizontal plane with a top of the folding portion.

In the folding display device provided in an embodiment of the present application, the first chute includes a first sub-chute disposed on the first housing and a second sub-chute disposed on the second housing, and the first sub-chute and the second sub-chute being disposed symmetrically relative to a center line of the second chute.

In the folding display device provided in an embodiment of the present application, at any time, in a direction perpendicular to a cross section of the folding portion, an angle between the first support plate and the first housing, an angle between the second support plate and the second housing, an angle between the first rotating plate and the first housing, and an angle between the second rotating plate and the second housing are equal; an angle between the first rotating plate and the folding portion is different from an angle between the first housing and the folding portion; and an angle between the second rotating plate and the folding portion is different from an angle between the second housing and the folding portion.

In the folding display device provided in an embodiment of the present application, when the folding display device is in the unfolded state, the first housing rotates around the folding portion by a rotation first center, the second housing rotates around the folding portion by a second rotation center, the first rotating plate rotates around the folding portion by a third rotation center, the second rotating plate rotates around the folding portion by a fourth rotation center, the first support plate rotates around the first housing by a fifth rotation center, and the second support plate rotates around the second housing by a sixth rotation center.

The first rotation center and the second rotation center are respectively located on a cross section of the folding portion, the first rotation center and the second rotation center are disposed symmetrically relative to the longitudinal symmetry axis of the folding portion; the third rotation center is located at a position connected the first rotating plate and the folding portion, the fourth rotation center is located at a position connected the first rotating plate and the folding portion, the third rotation center and the fourth rotation center are disposed symmetrically relative to the longitudinal axis of the folding portion, the fifth rotation center is located at a center of the first arc-shaped protrusion, the sixth rotation center is located at a center of the second arc-shaped protrusion, and the fifth rotation center and the sixth rotation center are disposed symmetrically relative to the longitudinal symmetry axis of the folding portion.

In the folding display device provided in an embodiment of the present application, a spacing between the second rotation center and the longitudinal symmetry axis of the folding portion ranges from 0 mm to 3 mm, a spacing between the second rotation center and a surface of the second support plate away from the folding portion ranges from 0 mm to 1 mm, a spacing between the fourth rotation center and the longitudinal symmetry axis of the folding portion ranges from 2 mm to 8 mm, a spacing between the fourth rotation center and a surface of the second support plate away from the folding portion ranges from 0 mm to 2 mm, a spacing between the sixth rotation center and the longitudinal symmetry axis of the folding portion ranges from 5 mm to 25 mm, and a spacing between the sixth rotation center and a surface of the second support plate away from the folding portion ranges from 0 mm to 1.5 mm.

Beneficial Effects

A folding display device is provided in an embodiment of the present application. By providing rotating plate on either side of a symmetry longitudinal axis of a folding portion of the folding display device, when the folding display device is folded, a support plate in the folding region is inclined to spare space for a display screen to form a droplet-like shape. At the same time, a housing on either side of the folding portion is linked during rotation by a linkage slider, which replaces a conventional gear linkage design. Thus, when the folding display device is in an unfolded state, the support plate in the folding region is restored to be even to support entire surface of the display screen in the folding region, and the folding display device remains in a symmetrical state throughout folding, thereby further reducing damage to the display screen caused by the folding display device.

DETAILED DESCRIPTION OF EMBODIMENTS

The embodiments solve a technical problem that a surface between an inner folding mechanism and a display screen is uneven when folded, due to excessive volume occupied by a rail inner folding mechanism of a folding display device of the prior art.

Referring to FIG. 1 to FIG. 6B, an embodiment of the present application provides a folding display device 100 including a housing, a folding mechanism 13, a flexible display panel 20, and a linkage slider 14.

The housing includes a first housing 11 and a second housing 12. The folding mechanism 13 is accommodated in the housing and connected to the first housing 11 and the second housing 12. The folding mechanism 13 includes a folding portion 131, a first support plate 134 and a first rotating plate 132 provided at one side of the folding portion 131 and corresponding to the first housing 11, a second support plate 135 and a second rotating plate 133 provided at the other side of the folding portion 131 and corresponding to the second housing 12, and the linkage slider 14. The first support plate 134 is connected to the first housing 11. A first end of the first rotating plate 132 is slidably connected to the first support plate 134, and a second end of the first rotating plate 132 is rotatably connected to one side of the folding portion 131. A first end of the second rotating plate 133 is slidably connected to the second support plate 135, and a second end of the second rotating plate 133 is rotatably connected to the other side of the folding portion 131. The flexible display panel 20 is disposed in the housing and on one side of the first housing 11, the second housing 12, and the folding mechanism 13. The linkage slider 14 is disposed at a longitudinal symmetry axis of the folding portion 131, slidably connected along the longitudinal symmetry axis of the folding portion 131, and slidably connected to a side of the first housing 11 and the second housing 12, respectively.

The details of the application will now be described with reference to specific embodiments.

Figure 1:
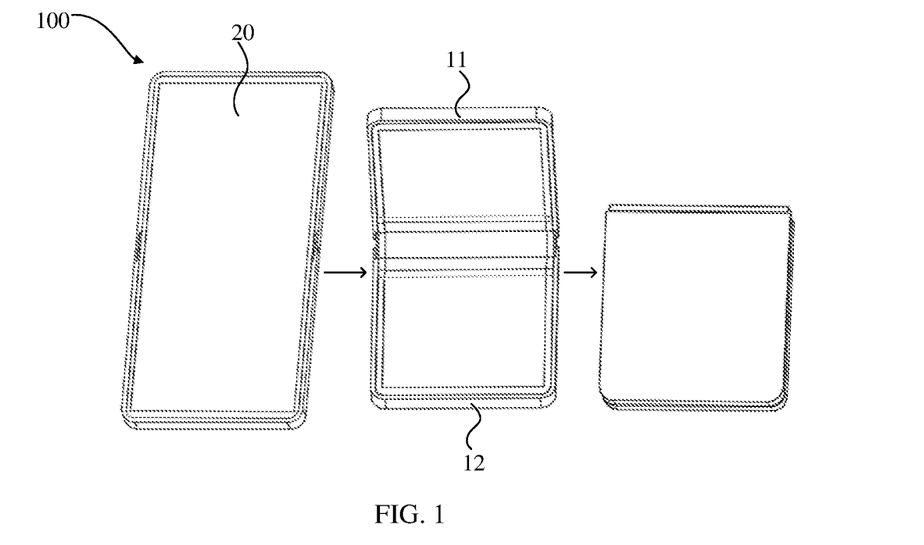
FIG. 1 is a schematic diagram of a folding display device according to an embodiment of the present application from an unfold state to a fully folded state.

Reference is made to FIG. 1, which is a schematic diagram of a folding display device 100 from an unfolded state to a fully folded state in accordance with an embodiment of the present application. The folding display device 100 includes a housing, a folding mechanism 13 and a flexible display panel 20. The housing includes a first housing 11 and a second housing 12. The folding mechanism 13 is accommodated in the housing and connected to the first housing 11 and the second housing 12, and the flexible display panel 20 is disposed in the housing and on one side of the first housing 11, the second housing 12, and the folding mechanism 13.

Specifically, when the folding display device 100 is in an unfolded state, the first housing 11, the second housing 12, and the folding mechanism 13 are on a same plane. When the folding display device 100 is in an inwardly folded state, the first housing 11 and the second housing 12 are disposed symmetrically to a longitudinal symmetry axis of the folding mechanism 13. When the folding display device 100 is in a fully folded state, an orthographic projection of the first housing 11 on the flexible display panel 20 overlaps with an orthographic projection of the second housing 12 on the flexible display panel 20.

Figure 2:
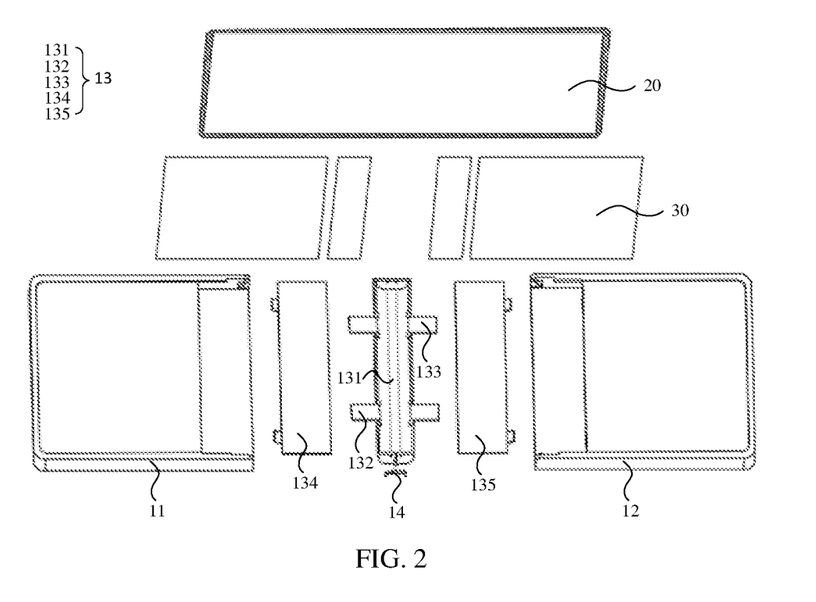
FIG. 2 is an exploded schematic diagram of the folding display device according to an embodiment of the present application.

Reference is made to FIG. 2, which is an exploded schematic diagram of a folding display device 100 in accordance with an embodiment of the present application. The folding mechanism 13 includes a folding portion 131, a first support plate 134 and a first rotating plate 132 disposed on one side of the folding portion 131 and corresponding to the first housing 131, a second support plate 135 and a second rotating plate 133 disposed on the other side of the folding portion 131 and corresponding to the second housing 131, and a linkage slider 14. The first support plate 134 is connected to the first housing 11. A first end of the first rotating plate 132 is slidably connected to the first support plate 134, and a second end of the first rotating plate 132 is rotatably connected to one side of the folding portion 131. A first end of the second rotating plate 133 is slidably connected to the second support plate 135, and a second end of the second rotating plate 133 is rotatably connected to the other side of the folding portion 131. The flexible display panel 20 is disposed in the housing and on one side of the first housing 11, the second housing 12, and the folding mechanism 13. The linkage slider 14 is disposed at a longitudinal symmetry axis of the folding portion 131, slidably connected along the longitudinal symmetry axis of the folding portion 131, and slidably connected to one side of the first housing 11 and the second housing 12, respectively.

Specifically, the folding portion 131 is horizontally disposed, and its cross section is an axisymmetric structure mirrored along the longitudinal symmetry axis. The first rotating plate 132 is disposed on a first side of the longitudinal symmetry axis of the folding portion 131, and a first end of the first rotating plate 132 is axially connected to the folding portion 131. The second rotating plate 133 is disposed on a second side of the longitudinal symmetry axis of the folding portion 131 opposite to the first side, and is mirrored to the first rotating plate 132 relative to the longitudinal symmetry axis. The first end of the second rotating plate 133 is axially connected to the folding portion 131.

In an embodiment of the present application, the first rotating plate 132 includes two first sub-rotating plates, and the second rotating plate 133 includes two second sub-rotating plates. The first sub-rotating plate and the second sub-rotating plate adjacent to it are mirrored with respect to the longitudinal symmetry axis, a spacing between the two first rotating plates 132 is equal to a spacing between the two second rotating plates 133.

In an embodiment of the present application, the first housing 11 is disposed on the first side of the longitudinal symmetry axis of the folding portion 131, and the first housing 11 is axially connected to the folding portion 131. The second housing 12 is disposed on the second side of the longitudinal symmetry axis of the folding portion 131, opposite to the first side, and is axially connected to the folding portion 131.

In an embodiment of the present application, the first support plate 134 is disposed on the first rotating plate 132 and the folding portion 131, and the second support plate 135 is disposed on the second rotating plate 133 and the folding portion 131. The first support plate 134 is used to connect the first rotating plate 132 with the first housing 11, and the second support plate 135 is used to connect the second rotating plate 133 with the second housing 12. The first support plate 134 and the second support plate 135 have rectangular plate shapes, and have the same length and width.

In an embodiment of the present application, the folding display device 100 further includes the linkage slider 14, and with the folding display device 100 from the unfolded state to the fully folded state, the linkage slider 14 maintains an angle between the first housing 11 and the folding portion 131 always equal to an angle between the second housing 12 and the folding portion 131.

In an embodiment of the present application, the folding display device 100 further includes a viscous layer 30 covering the first support plate 134, the second support plate 135, the first housing 11, and the second housing 12, respectively. The viscous layer 30 is used for bonding the flexible display panel 20 to the first support plate 134, the second support plate 135, the first housing 11, and the second housing 12, respectively.

Figure 3A:
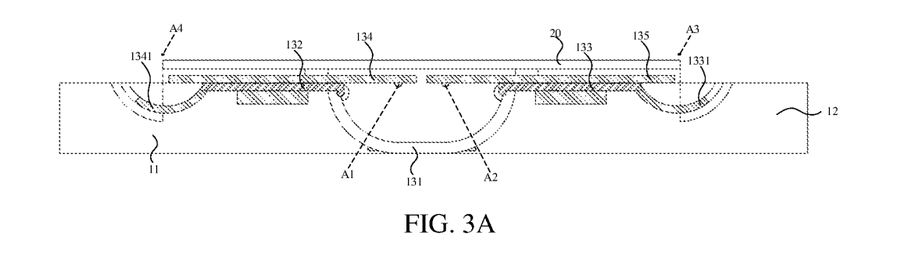
FIGS. 3A-3C are schematic diagrams of rotation principle of the folding display device according to an embodiment of the present application.
Figure 3B:
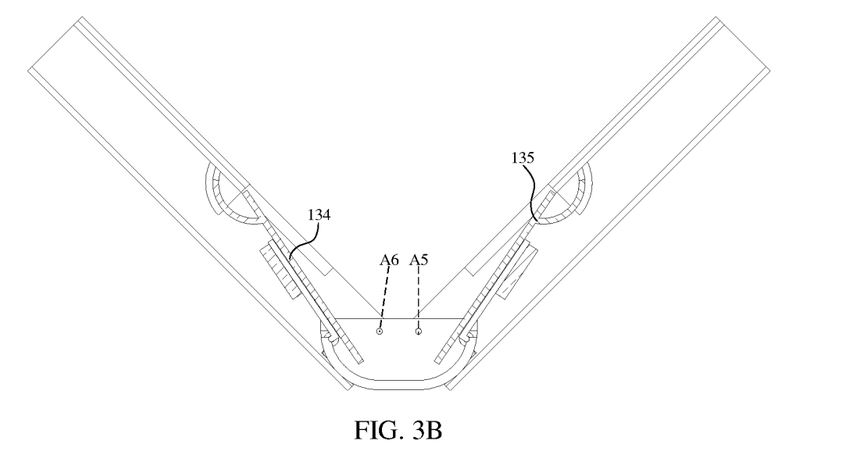
Figure 3C:
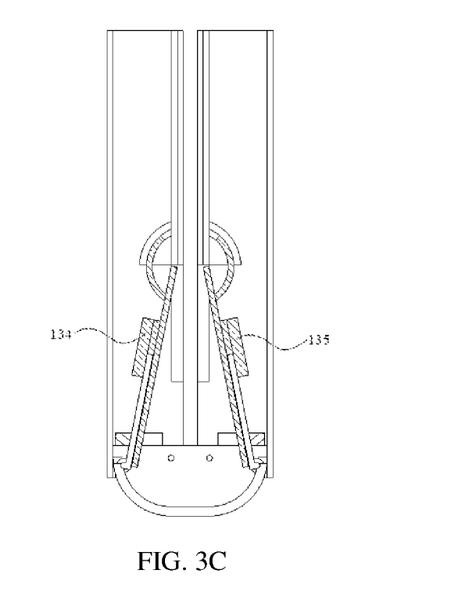

References are made to FIG. 3a, FIG. 3B and FIG. 3C, which are schematic diagrams of rotation principle of the folding display device 100 according to an embodiment of the present application. Specifically, a first arc-shaped chute is provided inside the first housing 11, and a first arc-shaped protrusion 1341 corresponding to the first arc-shaped chute is provided on the first support plate 134. A second arc-shaped chute is provided inside the second housing 12, and a second arc-shaped protrusion 1331 corresponding to the second arc-shaped chute is provided on the second support plate 135.

The first arc-shaped protrusion 1341 and the second arc-shaped protrusion 1331 are disposed symmetrically relative to the longitudinal symmetry axis of the folding portion 131.

In an embodiment of the present application, a bottom edge of the cross-section of the folding portion 131 is provided with a second protrusion, and a protruding direction of the first arc-shaped protrusion 1341 or the second arc-shaped protrusion 1331 is the same as a protruding direction of the second protrusion.

Further, a first linear chute is disposed on a side surface the first rotating plate 132 away from the flexible display panel 20, and the first rotating plate 132 is slidably connected to the first support plate 134 via the first linear chute. A second linear chute is disposed on a side surface of the second rotating plate 133 away from the flexible display panel 20, and the second rotating plate 133 is slidably connected to the second support plate 135 via the second linear chute.

When the folding display device 100 is in an unfolded state, the longitudinal symmetry axis of the folding portion 131 is referred as a y coordinate axis, and a line intersecting with the y coordinate axis and provided in same plane with a surface of the first support plate 134 and the second support plate 135 away from the folding portion 131 is referred a x coordinate axis. The x coordinate axis is coplanar with and perpendicular to the y coordinate axis, and the x coordinate axis and the y coordinate axis intersect as a coordinate origin o. The x coordinate axis, the y coordinate axis, and the coordinate origin o form a xoy coordinate plane.

A coordinate of a second rotation center A2 between the second housing 12 and the folding portion 131 is (x1, y1), a coordinate of a first rotation center A1 between the first housing 11 and the folding portion 131 is (−x1, y1), a coordinate of a fourth rotation center A4 between the second rotating plate 133 and the folding portion 131 is (x2, y2), a coordinate of a third rotation center A3 between the first rotating plate 132 and the folding portion 131 is (−x2, y2), a coordinate of a sixth rotation center A6 between the second support plate 135 and the second housing 12 is (x3, y3), and a coordinate of a fifth rotation center A5 between the first support plate 134 and the first housing 11 is (−x3, y3).

Depending on flexure stress condition of the flexible screen and size limit to generally inwards folding phone, the sizes need to be limited as follows: x1 is greater than 0 and less than or equal to 3 mm, y1 is greater than or equal to −1 mm and less than or equal to 1 mm, x2 is greater than or equal to 3 mm and less than or equal to 8 mm, y2 is greater than or equal to −2 mm and less than 0, x3 is greater than or equal to 5 mm and less than or equal to 25 mm, and y3 is greater than or equal to −1.5 mm and less than or equal to 1.5 mm.

In an embodiment of the present application, with the folding display device 100 from unfolded state to folded state, a spacing from the first end of the first rotating plate 132 to the first arc-shaped protrusion 1341 gradually increases, and a spacing from the first end of the second rotating plate 133 to the second arc-shaped protrusion 1331 gradually increases.

Specifically, the rotation principle of the folding display device 100 is as follows:

The first housing 11 and the second housing 12 are axially connected to the folding portion 131, and the first housing 11 and the second housing 12 rotate relative to the folding portion 131 around respective axes. One end of the first rotating plate 132 or the second rotating plate 133 is also axially connected to the folding portion 131, this is, the rotating plate rotates around the axis relative to the folding portion 131. The other end of the first rotating plate 132 is connected to the first support plate 134 via a linear chute, and the other end of the second rotating plate 133 is connected to the second support plate 135 via a linear chute. Therefore, the first support plate 134 may linearly slide relative to the first rotating plate 132, and the second support plate 135 may linearly slide relative to the second rotating plate 133. Meanwhile, the other end of the first support plate 134 is connected to the first housing 11 via an arc-shaped chute, and the other end of the second support plate 135 is connected to the second housing 12 via an arc-shaped chute. A center of the arc-shaped chute is a rotation center between the first support plate 134 and the first housing 11 or between the second support plate 135 and the second housing 12, that is, the first support plate 134 may rotate relative to the first housing 11 around the rotation center and the second support plate 135 may rotate relative to the second housing 12 around the rotation center. When the first housing 11 or the second housing 12 and the folding portion 131 rotate around respective rotation centers, the first rotating plate 132 rotates around a rotation center between the first rotating plate 132 and the folding portion 131, and the second rotating plate 133 also rotates around a rotation center between the second rotating plate 133 and the folding portion 131. Meanwhile, the first support plate 134 about a rotation center between the first support plate 134 and the first housing 11, and the second support plate 135 rotates synchronously about a rotation center between the second support plate 135 and the second housing 12. Since the first support plate 134 is connected to the first rotating plate 132 by a linear chute, and the second support plate 135 is connected to the second rotating plate 133 by a linear chute, an angle between the first support plate 134 and the first housing 11 or between the second support plate 135 and the second housing 12 is always equal to an angle between the first rotating plate 132 and the first housing 11 or between the second rotating plate 133 and the second housing 12. Since a rotation center of the first rotating plate 132 or the second rotating plate 133 rotating relative to the folding portion 131 is inconsistent with a rotation center of the first housing 11 or the second housing 12 rotating relative to the folding portion 131, when the first housing 11 and the second housing 12 rotate relative to the folding portion 131, a rotation angle between the first rotating plate 132 and the folding portion 131 or between the second rotating plate 133 and the folding portion 131 is different from a rotation angle between the first housing 11 and the folding portion 131 or between the second housing 12 and the folding portion 131. Thus, the first support plate 134 inclines a certain angle relative to the first housing 11, and the second support plate 135 inclines a certain angle relative to the second housing 12. The angle is determined collectively by a position of the rotation center between the first rotating plate 132 or the second rotating plate 133 and the folding portion 131, a position of the rotation center between the first housing 11 or the second housing 12 and the folding portion 131, a position of the rotation center between the first support plate 134 and first housing 11, and a position of the rotation center between the second support plate 135 and the second housing 12. Therefore, when the first housing 11 and the second housing 12 rotate relative to the folding portion 131, the first support plate 134 and the second support plate 135 located in the folding region inclines downward to spare a space for the flexible display panel 20 to fold. After being fully folded, the first support plate 134 and the second support plate 135 forms a wedge shape, so that the flexible display panel 20 in the folding region forms a droplet shape.

Figure 4A:
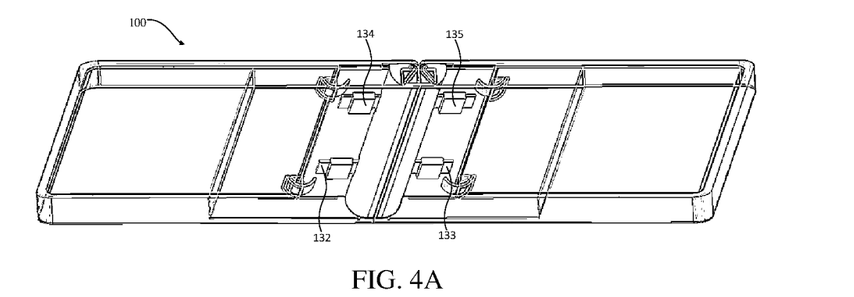
FIG. 4A is a plan schematic diagram of the folding display device in an unfolded state according to an embodiment of the present application.
Figure 4B:
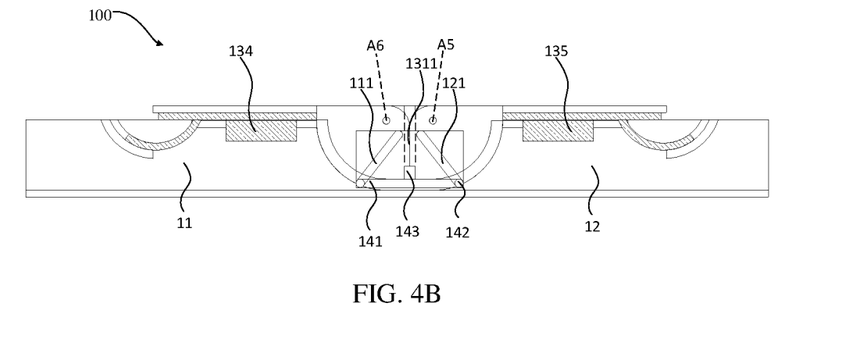
FIG. 4B is a cross-sectional schematic diagram of the folding display device in a folded state according to an embodiment of the present application.

Reference is made to FIG. 4A, which is a plan schematic diagram of the folding display device 100 in an unfolded state according to an embodiment of the present application. Reference is made to FIG. 4B, a cross-sectional schematic diagram of the folding display device 100 in an unfolded state according to an embodiment of the present application. According to FIGS. 4A and 4B, the linkage slider 14 includes:

- a slider body 141, horizontally disposed along the longitudinal symmetry axis of the folding portion 131, and slidably connected to the folding portion 131 along the longitudinal symmetry axis of the folding portion 131;
- a cylindrical slider 142, horizontally disposed at two ends of the slider body 141, and slidably connected to the first chute inside the first housing 11 or the second housing 12; and
- a rectangular slider 143, disposed on the slider body 141 and vertical to the longitudinal symmetry axis of the folding portion 131, and slidably connected to a second chute 1311 inside the folding portion 131.

In an embodiment of the present application, the first chute includes a first sub-chute 111 disposed on the first housing 11 and a second sub-chute 121 disposed on the second housing 12. The first sub-chute 111 and the second sub-chute 121 are axially symmetrically disposed with respect to the second chute 1311.

Further, when the folding display device 100 is in an unfolded state, an angle between the first sub-chute 111 or the second sub-chute 121 and the second chute 1311 is 45°. The cylindrical slider 142 is on a same horizontal plane with bottom of the folding portion 131.

Figure 5A:
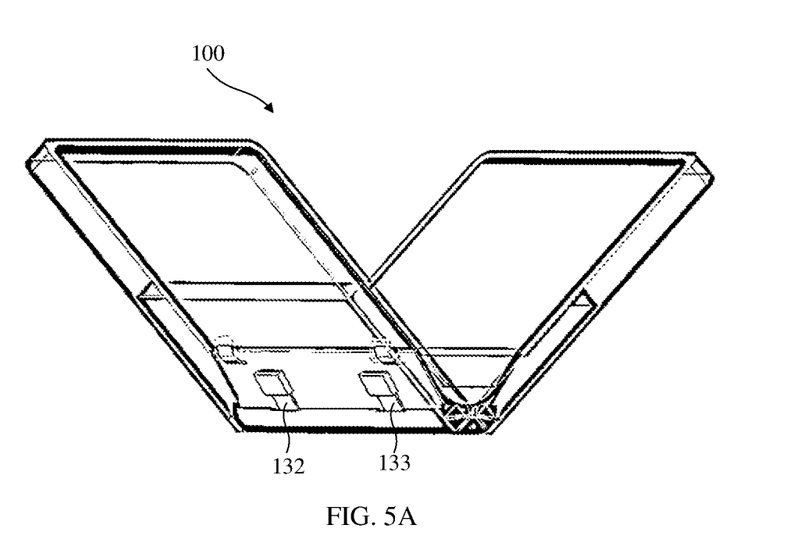
FIG. 5A is a side schematic diagram of the folding display device inwardly folded to 90° according to an embodiment of the present application.
Figure 5B:
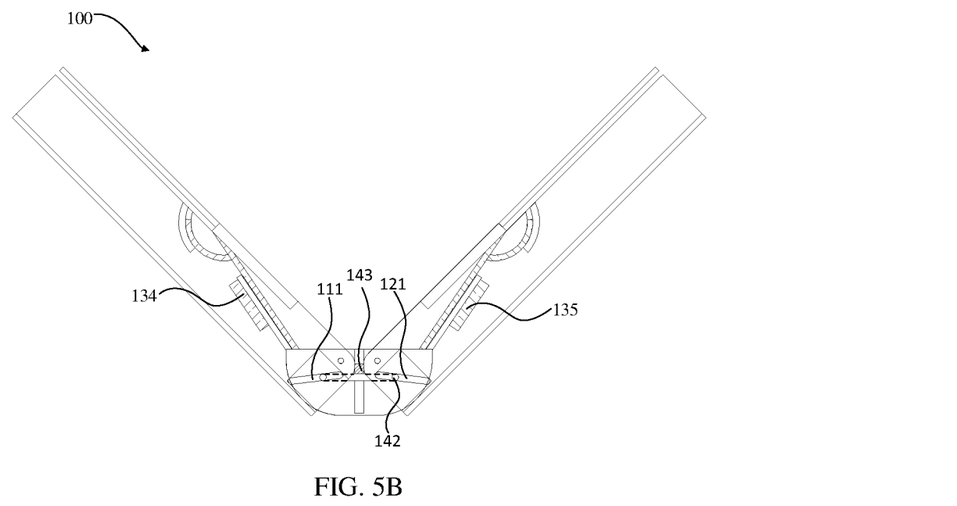
FIG. 5B is a cross-sectional schematic diagram of the folding display device inwardly folded to 90° according to an embodiment of the present application.

Reference is made to FIG. 5A, which is a side schematic diagram of the folding display device 100 inwardly folded to 90° according to an embodiment of the present application. Reference is made to FIG. 5B, which is a cross-sectional schematic diagram of the folding display device 100 inwardly folded to 90° according to an embodiment of the present application.

When the folding display device 100 is folded inwardly to 90°, if a height of the rectangular slider 143 is set to h, and a length of the slider body 141 is set to L, the angle between the first sub-chute 111 or the second sub-chute 121 and the second chute 1311 is equal to arctan(2 h/L).

Figure 6A:
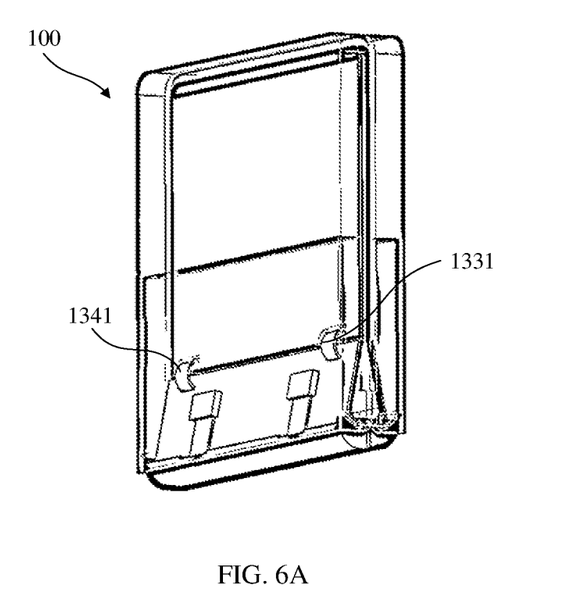
FIG. 6A is a side schematic diagram of the folding display device in a fully folded state according to an embodiment of the present application.
Figure 6B:
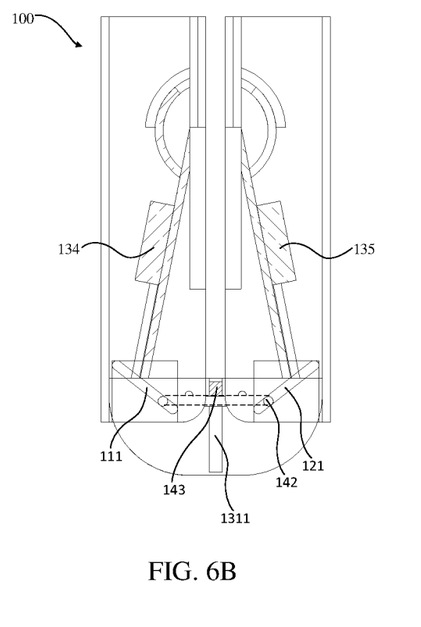
FIG. 6B is a cross-sectional schematic diagram of the folding display device in a fully folded state according to an embodiment of the present application.

Reference is made to FIG. 6A, which is a side schematic diagram of the folding display device 100 in a fully folded state according to an embodiment of the present application. Reference is made to FIG. 6B, a cross-sectional schematic diagram of the folding display device 100 in the fully folded state according to an embodiment of the present application.

With the folding display device 100 in the fully folded state, a top of the rectangular slider 143 and a top of the folding portion 131 are on a same horizontal plane, and the angle between the first sub-chute 111 or the second sub-chute 121 and the second chute 1311 is 135°.

Specifically, with the folding display device 100 folding inwardly to 90° from an unfolded state and finally to a fully folded state, since the cylindrical slide 142 on the slide body 141 cooperates with the chutes disposed inside the first housing 11 and the second housing 12, and the rectangular slide 143 disposed in a middle of the slide body 141 cooperates with the linear chute on the folding portion 131, when the first housing 11 rotates relative to the folding portion 131, the first sub-chute 111 on the inner wall of the first housing 11 drives the cylindrical slide 142 on the slide body 141 to move upward. Since the rectangular slide 143 on the slide body 141 is restricted by the second chute 1311 on the folding portion 131 to merely translate upward and downward, the slide body 141 is driven to translate upward. Thus, due to the cylindrical slider 142 being cooperated with the second sub-chute 121 on the inner wall of the second housing 12, the slider body 141 drives the second housing 12 to rotate an angle equal to and opposite to the first housing 11, so that the first housing 11 and the second housing 12 remain positionally symmetrically throughout folding.

An embodiment of the present application provides a folding display device 100 including a folding portion 131, a first rotating plate 132, a first housing 11, a second housing 12, a first support plate 134, a second support plate 135, and a linkage slider 14.

The folding portion 131 is horizontally disposed and provided with an axisymmetric structure with a cross section mirrored along a longitudinal symmetry axis. The first rotating plate 132 is disposed on a first side of a longitudinal symmetry axis of the folding portion 131, and a first end of the first rotating plate 132 is axially connected to the folding portion 131. The second rotating plate 133 is disposed on a second side of the symmetry longitudinal axis of the folding portion 131, opposite to the first side, and is mirrored with the first rotating plate 132 with respect to the longitudinal symmetry axis. A first end of the second rotating plate 133 is axially connected to the folding portion 131. The first housing 11 is disposed on the first side of the longitudinal symmetry axis of the folding portion 131, and the first housing 11 is axially connected to the folding portion 131. The second housing 12 is disposed on the second side of the longitudinal symmetry axis of the folding portion 131, opposite to the first side, and the second housing 12 is axially connected to the folding portion 131. The first support plate 134 is disposed on the first rotating plate 132 and the folding portion 131, a first end of the first support plate 134 is in a first sliding connection with a second end of the first rotating plate 132, and a second end of the first support plate 134 is in a second sliding connection with the first housing 11. The second support plate 135 is disposed on the second rotating plate 133 and the folding portion 131, and mirrored with the first support plate 134 with respect to the symmetry longitudinal axis. A first end of the second support plate 135 is in the first sliding connection with a second end of the second rotating plate 133, and a second end of the second support plate 135 is in the second sliding connection with the second housing 12. At least one linkage slider 14 is disposed at the symmetry longitudinal axis of the folding portion 131, and connected to the first housing 11 and the second housing 12 in a third sliding connection.

When the linkage slider 14 is on a same horizontal plane with a bottom of the folding portion 131, the first housing 11 and the second housing 12 are unfolded to a same plane, and the folding display device 100 is in a first state. When the linkage slider 14 is on a same horizontal plane with a top of the folding portion 131, the first housing 11 and the second housing 12 are folded overlappingly, and the folding display device 100 is in a second state.

The folding display device 100 and the display device are provided in an embodiment of the present application. By providing the rotating plate on either side of the symmetry longitudinal axis of the folding portion 131 of the folding display device 100, when the folding display device 100 is folded, the support plate in the folding region is inclined to spare space for the display screen to form a droplet-like shape. At the same time, the housing on either side of the folding portion 131 is linked during rotation by the linkage slider 14, which replaces a conventional gear linkage design. Thus, when the folding display device 100 is in an unfolded state, the support plate in the folding region is restored to be even to support entire surface of the display screen in the folding region, and the folding display device 100 remains in the symmetrical state throughout folding, thereby further reducing damage to the display screen caused by the folding display device 100.

In the above, the descriptions of the various embodiments are each focused, and portions of some embodiments that are not detailed may be referred to the related descriptions of other embodiments.

The folding display device 100 and the display device provided in the embodiments of the present application are described in detail above. The principles and embodiments of the present application are described in detail herein. The description of the embodiments is merely intended to understand the technical solutions and core ideas of the present application. Those with ordinary skill in the art will appreciate that they may still modify the technical solutions described in the foregoing embodiments, or equivalently replace some of the technical features therein. These modifications or substitutions do not deviate the nature of the respective solutions from the scope of the solutions of the embodiments of the present application.

What is claimed is:

1. A folding display device, comprising:
a housing comprising a first housing and a second housing;
a folding mechanism accommodated in the housing and connected to the first housing and the second housing, wherein the folding mechanism is rotatably connected to the first housing and the second housing and comprises a folding portion;
a flexible display panel disposed in the housing and on a side of the first housing, the second housing, and the folding mechanism; and
a linkage slider disposed between the first housing or the second housing and the folding portion, and slidably connected along a longitudinal symmetry axis of the folding portion, wherein a first end of the linkage slider is slidably connected to a side of the first housing close to the folding portion, and a second end of the linkage slider is slidably connected to a side of the second housing close to the folding portion; and
wherein the first housing, the second housing, and the folding mechanism are on a same plane when the folding display device is in an unfolded state; the first housing and the second housing are disposed symmetrically relative to a longitudinal symmetry axis of the folding mechanism when the folding display device is in an inwardly folded state; and an orthographic projection of the first housing on the flexible display panel overlaps with an orthographic projection of the second housing on the flexible display panel when the folded display device is in a fully folded state;
wherein the folding mechanism further comprises:
a first support plate and a first rotating plate disposed on a first side of the folding portion and corresponding to the first housing; and
a second support plate and a second rotating plate disposed on a second side of the folding portion and corresponding to the second housing; and
wherein the first support plate is connected to the first housing, a first end of the first rotating plate is slidably connected to the first support plate, a second end of the first rotating plate is rotatably connected to the first side of the folding portion, a first end of the second rotating plate is slidably connected to the second support plate, and a second end of the second rotating plate is slidably connected to the second side of the folding portion;
wherein a first arc-shaped chute is provided within the first housing, a first arc-shaped protrusion corresponding to the first arc-shaped chute is provided on the first support plate, a second arc-shaped chute is provided within the second housing, and a second arc-shaped protrusion corresponding to the second arc-shaped chute is provided on the second support plate; and
wherein the first arc-shaped protrusion and the second arc-shaped protrusion are disposed symmetrically relative to the longitudinal symmetry axis of the folding portion.

2. The folding display device according to claim 1, wherein a protrusion direction of the first arc-shaped protrusion or the second arc-shaped protrusion is same as a protrusion direction of a bottom edge of a cross section of the folding portion.

3. The folding display device according to claim 1, wherein a first linear chute is provided on a surface of the first rotating plate away from the flexible display panel, and the first rotating plate is slidably connected to the first support plate via the first linear chute;
a second linear chute is provided on a surface of the second rotating plate away from the flexible display panel, and the second rotating plate is slidably connected to the second support plate via the second linear chute; and
wherein with the folding display device from the unfold state being folded to the folded state, a spacing of the first end of the first rotating plate to the first arc-shaped protrusion is gradually increased and a spacing of the first end of the second rotating plate to the second arc-shaped protrusion is gradually increased.

4. The folding display device according to claim 1, wherein the linkage slider comprises:
a slider body disposed parallel to a direction of a bottom of the housing and slidably connected to the folding portion at a longitudinal symmetry axis of the folding portion;
a cylindrical slider disposed at either end of the slider body and slidably connected to a first chute on an inner side of the first housing or the second housing; and
a rectangular slider located on the slider body, wherein a longitudinal symmetry axis of the rectangular slider overlaps with the longitudinal symmetry axis of the folding portion, and the rectangular slider is slidably connected to a second chute on an inner side of the folding portion; and when the folding display device is in the unfolded state, the cylindrical slider is located on a same horizontal plane with a bottom of the folding portion; and when the folding display device is in the folded state, a top of the rectangular slider is located on a same horizontal plane with a top of the folding portion.

5. The folding display device according to claim 4, wherein the first chute comprises a first sub-chute disposed on the first housing and a second sub-chute disposed on the second housing, and the first sub-chute and the second sub-chute are disposed symmetrically relative to a center line of the second chute.

6. The folding display device according to claim 1, wherein at any time, in a direction perpendicular to a cross section of the folding portion, an angle between the first support plate and the first housing, an angle between the second support plate and the second housing, an angle between the first rotating plate and the first housing, and an angle between the second rotating plate and the second housing are equal; an angle between the first rotating plate and the folding portion is different from an angle between the first housing and the folding portion; and an angle between the second rotating plate and the folding portion is different from an angle between the second housing and the folding portion.

7. The folding display device according to claim 1, wherein when the folding display device is in the unfolded state, the first housing rotates around the folding portion by a first rotation center, the second housing rotates around the folding portion by a second rotation center, the first rotating plate rotates around the folding portion by a third rotation center, the second rotating plate rotates around the folding portion by a fourth rotation center, the first support plate rotates around the first housing by a fifth rotation center, and the second support plate rotates around the second housing by a sixth rotation center; and
wherein the first rotation center and the second rotation center are respectively located on a cross section of the folding portion, the first rotation center and the second rotation center are disposed symmetrically relative to the longitudinal symmetry axis of the folding portion; the third rotation center is located at a position connected the first rotating plate and the folding portion, the fourth rotation center is located at a position connected the first rotating plate and the folding portion, the third rotation center and the fourth rotation center are disposed symmetrically relative to the longitudinal axis of the folding portion, the fifth rotation center is located at a center of the first arc-shaped protrusion, the sixth rotation center is located at a center of the second arc-shaped protrusion, and the fifth rotation center and the sixth rotation center are disposed symmetrically relative to the longitudinal symmetry axis of the folding portion.

8. The folding display device according to claim 7, wherein a spacing between the second rotation center and the longitudinal symmetry axis of the folding portion ranges from 0 mm to 3 mm, a spacing between the second rotation center and a surface of the second support plate away from the folding portion ranges from 0 mm to 1 mm, a spacing between the fourth rotation center and the longitudinal symmetry axis of the folding portion ranges from 2 mm to 8 mm, a spacing between the fourth rotation center and a surface of the second support plate away from the folding portion ranges from 0 mm to 2 mm, a spacing between the sixth rotation center and the longitudinal symmetry axis of the folding portion ranges from 5 mm to 25 mm, and a spacing between the sixth rotation center and a surface of the second support plate away from the folding portion ranges from 0 mm to 1.5 mm.

9. A folding display device, comprising:
a housing comprising a first housing and a second housing;
a folding mechanism accommodated in the housing and connected to the first housing and the second housing, wherein the folding mechanism is rotatably connected to the first housing and the second housing and comprises a folding portion;
a flexible display panel disposed in the housing and on a side of the first housing, the second housing, and the folding mechanism; and
a linkage slider disposed between the first housing or the second housing and the folding portion, and slidably connected along a longitudinal symmetry axis of the folding portion, wherein a first end of the linkage slider is slidably connected to a side of the first housing close to the folding portion, and a second end of the linkage slider is slidably connected to a side of the second housing close to the folding portion;
wherein the folding mechanism further comprises:
a first support plate and a first rotating plate disposed on a first side of the folding portion and corresponding to the first housing; and
a second support plate and a second rotating plate disposed on a second side of the folding portion and corresponding to the second housing; and
wherein the first support plate is connected to the first housing, a first end of the first rotating plate is slidably connected to the first support plate, a second end of the first rotating plate is rotatably connected to the first side of the folding portion, a first end of the second rotating plate is slidably connected to the second support plate, and a second end of the second rotating plate is slidably connected to the second side of the folding portion;
wherein the linkage slider comprises:
a slider body disposed parallel to a direction of a bottom of the housing and slidably connected to the folding portion at a longitudinal symmetry axis of the folding portion;
a cylindrical slider disposed at either end of the slider body and slidably connected to a first chute on an inner side of the first housing or the second housing; and
a rectangular slider located on the slider body, wherein a longitudinal symmetry axis of the rectangular slider overlaps with the longitudinal symmetry axis of the folding portion, and the rectangular slider is slidably connected to a second chute on an inner side of the folding portion; and
when the folding display device is in an unfolded state, the cylindrical slider is located on a same horizontal plane with a bottom of the folding portion; and when the folding display device is in the folded state, a top of the rectangular slider is located on a same horizontal plane with a top of the folding portion.

10. The folding display device according to claim 9, wherein a first arc-shaped chute is provided within the first housing, a first arc-shaped protrusion corresponding to the first arc-shaped chute is provided on the first support plate, a second arc-shaped chute is provided within the second housing, and a second arc-shaped protrusion corresponding to the second arc-shaped chute is provided on the second support plate; and
wherein the first arc-shaped protrusion and the second arc-shaped protrusion are disposed symmetrically relative to the longitudinal symmetry axis of the folding portion.

11. The folding display device according to claim 10, wherein a protrusion direction of the first arc-shaped protrusion or the second arc-shaped protrusion is same as a protrusion direction of a bottom edge of a cross section of the folding portion.

12. The folding display device according to claim 10, wherein a first linear chute is provided on a surface of the first rotating plate away from the flexible display panel, and the first rotating plate is slidably connected to the first support plate via the first linear chute; and
 a second linear chute is provided on a surface of the second rotating plate away from the flexible display panel, and the second rotating plate is slidably connected to the second support plate via the second linear chute; and
 wherein with the folding display device from the unfold state being folded to the folded state, a spacing of the first end of the first rotating plate to the first arc-shaped protrusion is gradually increased, and a spacing of the first end of the second rotating plate to the second arc-shaped protrusion is gradually increased.

13. The folding display device according to claim 9, wherein the first chute comprises a first sub-chute disposed on the first housing and a second sub-chute disposed on the second housing, and the first sub-chute and the second sub-chute being disposed symmetrically relative to a center line of the second chute.

14. The folding display device according to claim 9, wherein at any time, in a direction perpendicular to a cross section of the folding portion, an angle between the first support plate and the first housing, an angle between the second support plate and the second housing, an angle between the first rotating plate and the first housing, and an angle between the second rotating plate and the second housing are equal; an angle between the first rotating plate and the folding portion is different from an angle between the first housing and the folding portion; and an angle between the second rotating plate and the folding portion is different from an angle between the second housing and the folding portion.

15. The folding display device according to claim 10, wherein when the folding display device is in the unfolded state, the first housing rotates around the folding portion by a rotation first center, the second housing rotates around the folding portion by a second rotation center, the first rotating plate rotates around the folding portion by a third rotation center, the second rotating plate rotates around the folding portion by a fourth rotation center, the first support plate rotates around the first housing by a fifth rotation center, and the second support plate rotates around the second housing by a sixth rotation center; and
 wherein the first rotation center and the second rotation center are respectively located on a cross section of the folding portion, the first rotation center and the second rotation center are disposed symmetrically relative to the longitudinal symmetry axis of the folding portion; the third rotation center is located at a position connected the first rotating plate and the folding portion, the fourth rotation center is located at a position connected the first rotating plate and the folding portion, the third rotation center and the fourth rotation center are disposed symmetrically relative to the longitudinal axis of the folding portion, the fifth rotation center is located at a center of the first arc-shaped protrusion, the sixth rotation center is located at a center of the second arc-shaped protrusion, and the fifth rotation center and the sixth rotation center are disposed symmetrically relative to the longitudinal symmetry axis of the folding portion.

16. The folding display device according to claim 15, wherein a spacing between the second rotation center and the longitudinal symmetry axis of the folding portion ranges from 0 mm to 3 mm, a spacing between the second rotation center and a surface of the second support plate away from the folding portion ranges from 0 mm to 1 mm, a spacing between the fourth rotation center and the longitudinal symmetry axis of the folding portion ranges from 2 mm to 8 mm, a spacing between the fourth rotation center and a surface of the second support plate away from the folding portion ranges from 0 mm to 2 mm, a spacing between the sixth rotation center and the longitudinal symmetry axis of the folding portion ranges from 5 mm to 25 mm, and a spacing between the sixth rotation center and a surface of the second support plate away from the folding portion ranges from 0 mm to 1.5 mm.

17. A folding display device, comprising:
 a housing comprising a first housing and a second housing;
 a folding mechanism accommodated in the housing and connected to the first housing and the second housing, wherein the folding mechanism is rotatably connected to the first housing and the second housing and comprises a folding portion;
 a flexible display panel disposed in the housing and on a side of the first housing, the second housing, and the folding mechanism; and
 a linkage slider disposed between the first housing or the second housing and the folding portion, and slidably connected along a longitudinal symmetry axis of the folding portion, wherein a first end of the linkage slider is slidably connected to a side of the first housing close to the folding portion, and a second end of the linkage slider is slidably connected to a side of the second housing close to the folding portion;
 wherein the folding mechanism further comprises:
 a first support plate and a first rotating plate disposed on a first side of the folding portion and corresponding to the first housing; and
 a second support plate and a second rotating plate disposed on a second side of the folding portion and corresponding to the second housing; and
 wherein the first support plate is connected to the first housing, a first end of the first rotating plate is slidably connected to the first support plate, a second end of the first rotating plate is rotatably connected to the first side of the folding portion, a first end of the second rotating plate is slidably connected to the second support plate, and a second end of the second rotating plate is slidably connected to the second side of the folding portion;
 wherein at any time, in a direction perpendicular to a cross section of the folding portion, an angle between the first support plate and the first housing, an angle between the second support plate and the second housing, an angle between the first rotating plate and the first housing, and an angle between the second rotating plate and the second housing are equal; an angle between the first rotating plate and the folding portion is different from an angle between the first housing and the folding portion; and an angle between the second rotating plate and the folding portion is different from an angle between the second housing and the folding portion.

18. The folding display device according to claim 17, wherein a first arc-shaped chute is provided within the first housing, a first arc-shaped protrusion corresponding to the first arc-shaped chute is provided on the first support plate, a second arc-shaped chute is provided within the second housing, and a second arc-shaped protrusion corresponding to the second arc-shaped chute is provided on the second support plate; and wherein the first arc-shaped protrusion and the second arc-shaped protrusion are disposed symmetrically relative to the longitudinal symmetry axis of the folding portion.

19. The folding display device according to claim 18, wherein a protrusion direction of the first arc-shaped protrusion or the second arc-shaped protrusion is same as a protrusion direction of a bottom edge of a cross section of the folding portion.

20. The folding display device according to claim 18, wherein a first linear chute is provided on a surface of the first rotating plate away from the flexible display panel, and the first rotating plate is slidably connected to the first support plate via the first linear chute; and
- a second linear chute is provided on a surface of the second rotating plate away from the flexible display panel, and the second rotating plate is slidably connected to the second support plate via the second linear chute; and
- wherein with the folding display device from the unfold state being folded to the folded state, a spacing of the first end of the first rotating plate to the first arc-shaped protrusion is gradually increased, and a spacing of the first end of the second rotating plate to the second arc-shaped protrusion is gradually increased.

* * * * *